(12) United States Patent
Worledge

(10) Patent No.: US 8,107,285 B2
(45) Date of Patent: Jan. 31, 2012

(54) READ DIRECTION FOR SPIN-TORQUE BASED MEMORY DEVICE

(75) Inventor: Daniel C. Worledge, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/684,510

(22) Filed: Jan. 8, 2010

(65) Prior Publication Data

US 2011/0170340 A1 Jul. 14, 2011

(51) Int. Cl.
*G11C 11/15* (2006.01)

(52) U.S. Cl. .................. 365/171; 365/158; 365/173

(58) Field of Classification Search .......... 365/55, 365/66

See application file for complete search history.

(56) References Cited

U.S. PATENT DOCUMENTS

| 6,646,911 | B2 * | 11/2003 | Hidaka | 365/173 |
| 6,876,576 | B2 * | 4/2005 | Hidaka | 365/171 |
| 2002/0159288 | A1 | 10/2002 | Sunaga et al. | |
| 2008/0219044 | A1 | 9/2008 | Yoon et al. | |
| 2009/0141541 | A1 | 6/2009 | Covington | |
| 2009/0174015 | A1 | 7/2009 | Gu et al. | |

FOREIGN PATENT DOCUMENTS

| WO | 2007050679 A2 | 5/2007 |
| WO | 2008002813 A2 | 1/2008 |
| WO | 2008109772 A1 | 9/2008 |
| WO | 2008124704 A1 | 10/2008 |

OTHER PUBLICATIONS

International Search Report; International Application No. PCT/US 11/20011; International Filing Date: Jan. 3, 2011; Date of Mailing: Mar. 23, 2011.

International Search Report—Written Opinion; International Application No. PCT/US 11/20011; International Filing Date: Jan. 3, 2011; Date of Mailing: Mar. 23, 2011.

* cited by examiner

*Primary Examiner* — Tan T. Nguyen
(74) *Attorney, Agent, or Firm* — Cantor Colburn LLP; Vazken Alexanian

(57) ABSTRACT

A spin-torque based memory device includes a plurality of magnetic storage cells in an array, each magnetic storage cell includes at least one magnetic tunnel junction (MTJ) element, and at least one bit line and at least one bit complement line corresponding to the plurality of magnetic storage cells. Each respective MTJ element is written by driving a write current in a first or second direction to program the respective MTJ element in a low resistance state or a high resistance state and each respective MTJ element is read by driving a read current through the respective MTJ element in a direction that tends to disturb the respective MTJ element into the high resistance state.

18 Claims, 5 Drawing Sheets

READ DIRECTION FOR SPIN-TORQUE BASED MEMORY DEVICE

BACKGROUND

The present invention relates generally to magnetic random access memory (MRAM) devices, and more specifically, to the read direction for spin-torque based memory devices.

A spin torque magnetic random access memory (MRAM) device uses a spin-torque based memory element, for example, including a pinned layer, a tunnel barrier layer and a free layer in a magnetic tunnel junction (MTJ) stack. The magnetization of the pinned layer is fixed in a direction such that when current passes through the MTJ element, the free layer becomes either parallel or anti-parallel to the pinned layer. Resistance of the MTJ element depends on the relative orientation of the free layer and the pinned layer. When the free layer is parallel to the pinned layer, the MTJ element is in a low resistance state (e.g., a "0" memory state) and when they are anti-parallel, the MTJ element is in a high resistance state (e.g., a "1" memory state).

During the reading of data, a small current flows through the MTJ element and its resistance is compared with a pre-written MTJ cell (i.e., a reference cell), to determine whether the MTJ element being read is in a high or low resistance state. A problem associated with spin-torque memory devices is that the act of reading the MTJ element may disturb the data. In order to read the resistance of the MTJ element, current is passed through the MTJ element and the voltage across it is measured. This current may accidently write the MTJ element causing a "read" disturb.

During a read operation, even though a fixed voltage may be used to read, the voltage across the MTJ element during a read operation varies from MTJ element to MTJ element because the read voltage is placed across the MTJ element and transistor in series. Fluctuations in the resistance of the MTJ element and the resistance of the corresponding transistor may cause a fluctuation of read voltage on the MTJ element. Furthermore, this read voltage on the MTJ element depends on whether the MTJ element is in a high resistance state or a low resistance state during the read operation.

SUMMARY

Embodiments of the present invention provide spin-torque based memory device and method for performing a read operation within the spin torque based memory device by driving a read current through a magnetic tunnel junction (MTJ) element of the memory device in a particular direction, thereby preventing the occurrence of read disturbs. The direction is defined as a direction of current flow that would disturb the MTJ element into a high resistance state.

According to one embodiment of the present invention, a spin-torque based memory device is provided. The memory device includes a plurality of magnetic storage cells in an array, each magnetic storage cell includes at least one magnetic tunnel junction (MTJ) element, and at least one bit line and at least one bit complement line corresponding to the plurality of magnetic storage cells. Each respective MTJ element is written by driving a write current in a first or second direction to program the respective MTJ element in a low resistance state or a high resistance state and each respective MTJ element is read by driving a read current through the respective MTJ element in a direction defined as a direction that tends to disturb the respective MTJ element into the high resistance state.

According to another embodiment of the present invention, a computer-implemented method for operating a spin-torque based memory device including a plurality of magnetic storage cells each including at least one magnetic tunnel junction (MTJ) element is provided. The computer-implemented method includes programming a respective MTJ element into a low resistance state or a high resistance state by driving a write current in a first or second direction, and reading the respective MTJ element by driving a read current through the respective MTJ element in a direction that tends to disturb the respective MTJ element into the high resistance state.

According to another embodiment of the present invention, a computer program product performing the above-mentioned method is also provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
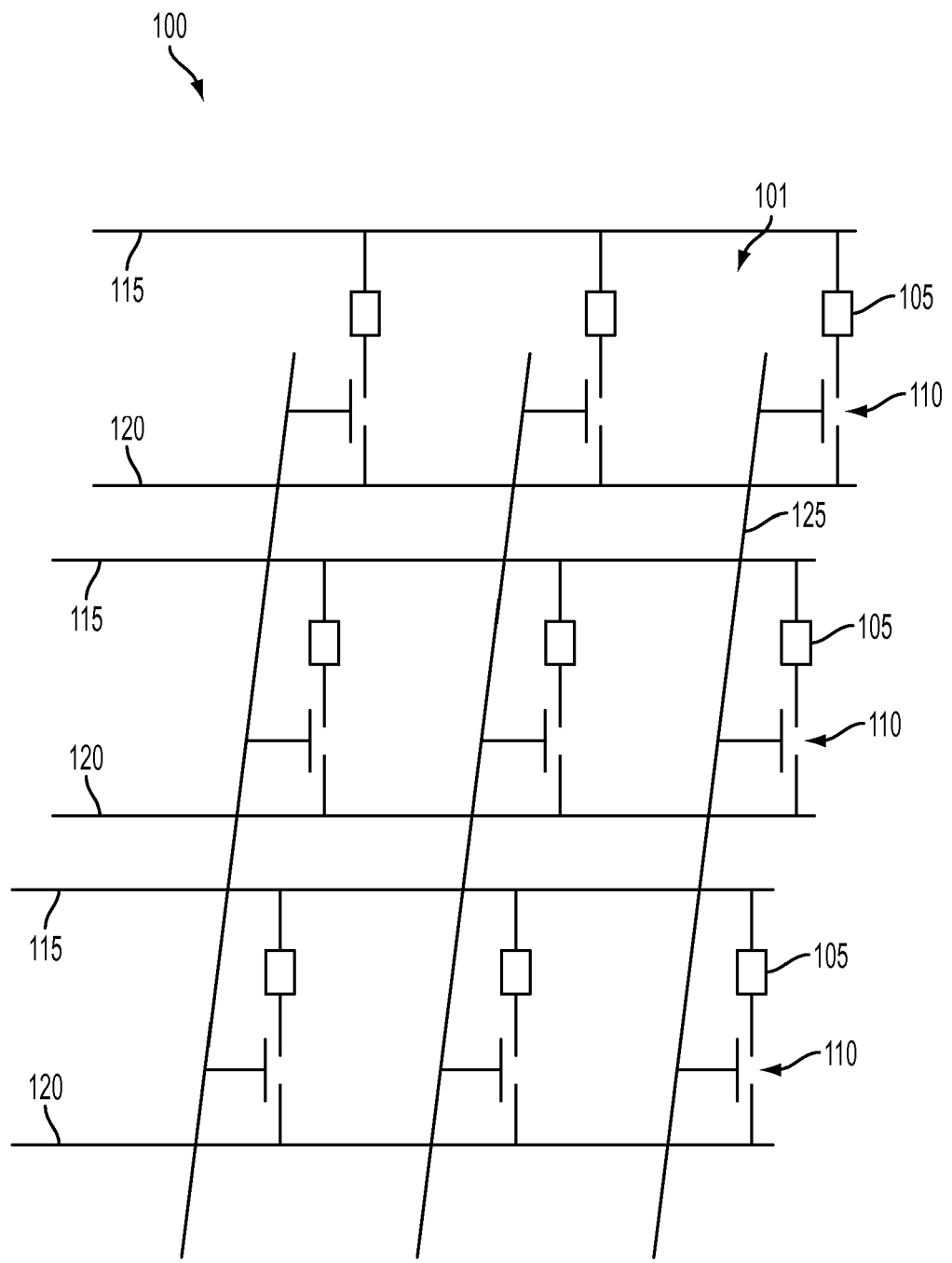
FIG. 1 is a diagram illustrating a memory device that can be implemented within an embodiment of the present invention.

With reference now to FIG. 1, a memory device in accordance with an embodiment of the present invention is provided. The memory device 100 is a spin-torque based magnetic random access memory (MRAM) device. As shown in FIG. 1, the spin-torque based MRAM device 100 includes a plurality of magnetic storage cells 101 in an array. Each magnetic storage cell 101 includes at least one MTJ element 105. Further, the device 100 includes a plurality of bit lines 115 and bit complement lines 120 corresponding to the plurality of magnetic storage cells 101.

As further shown in FIG. 1, each MTJ element 105 is connected in series to a switching device (e.g., a transistor 110). A plurality of word lines 125 are also provided within the memory device 100. The word line 125 is oriented obliquely to the bit line 115. The bit complement 120 is typically either parallel or perpendicular to the bit line 115, depending on the architecture for the memory device 100. As shown in this embodiment of the present invention, each bit complement line 120 is parallel to each bit line 115. Each word line 125 corresponds to a plurality of magnetic storage cells 101 and allows current to flow through the magnetic storage cells 101. In addition, each respective word line 125 is coupled to a gate of the transistor 110. The MTJ element 105 and the transistor 110 are connected together between a bit line 115 and a bit line complement 120. Details regarding programming and reading the MTJ elements 105 will be described below with reference to FIG. 2.

Figure 2:
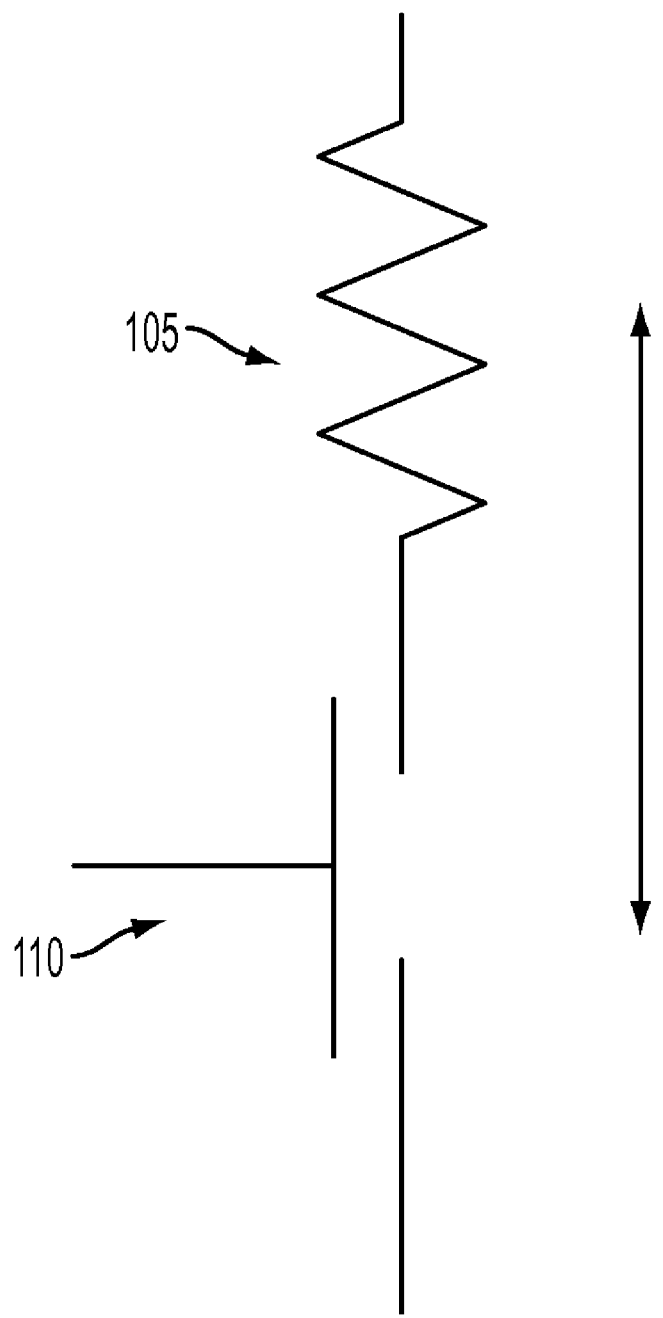
FIG. 2 is an exploded view of a MTJ element and a corresponding switching device of the memory device shown in FIG. 1 that can be implemented within embodiments of the present invention.
Figure 3:
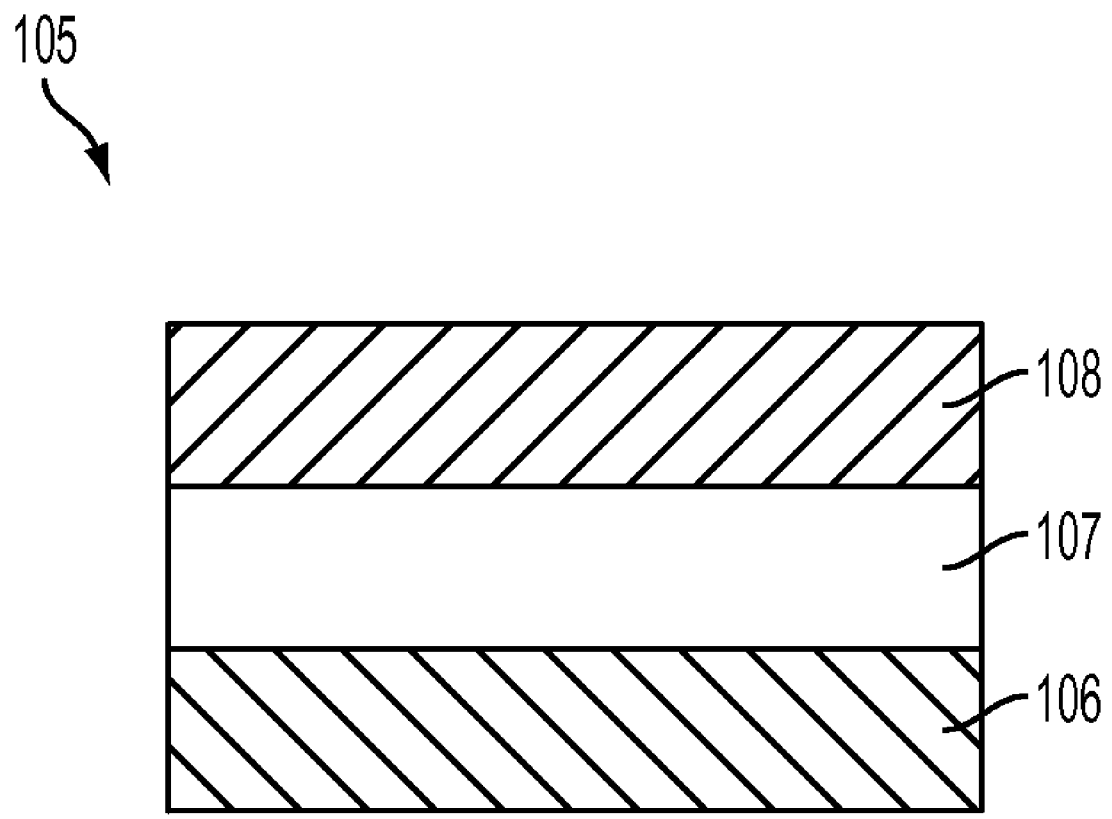
FIG. 3 is a diagram illustrating an example of layers within a MTJ element that can be implemented within embodiments of the present invention.

FIG. 2 is an exploded view of a MTJ element and a corresponding switching device of the memory device shown in FIG. 1 that can be implemented within embodiments of the present invention. According to an embodiment of the present invention, each MTJ element 105 may be formed of a pinned layer 106, a tunnel barrier layer 107 and a free magnetic layer 108 as shown in FIG. 3, however, the present invention is not limited hereto and may vary accordingly.

Referring back to FIG. 2, during a write or read operation, each respective transistor 110 is switched on to allow current to flow through the respective MTJ element 105, so that the logic state can be read or written. That is, the transistor 110 selects the MTJ element 105 to read or write.

During a write operation, the MTJ element 105 is configured to be written using spin transfer. Thus, spin-polarized electrons exert a torque on the free magnetic layer of the MTJ element 105, which can switch the polarity of the free magnetic layer. The bit line 115 and word line 125 are activated and a write current is driven between the bit complement 120 and the bit line 115. The write current is driven through the MTJ element 105 in a first or second direction to program the respective MTJ element 105 in a low resistance state or a high resistance state.

During a read operation, the bit line 115 and word line 125 are activated. The transistor 110 is then activated by the respective word line 125 and allows current to flow through the respective MTJ element 105. According to an embodiment of the present invention, a read current is driven through the respective MTJ element 105 in a direction that tends to disturb the respective MTJ element into a high resistance state. According to an embodiment of the present invention, the read current is less than the write current in the first or second direction. Further, according to an embodiment, the read voltage across the respective MTJ element 105 ranges from approximately 50 millivolts (mV) to approximately 100 mV. The read current is provided to the bit line 115. The read current is compared to a reference current flowing through a reference cell (not shown), by a sense amplifier (not shown). The output of the sense amplifier is proportional to the difference between the reference current and the current actually flowing through the MTJ element 105. The output of the sense amplifier determines the state of the MTJ element 105.

As mentioned above, a read disturb may occur during a read operation of a conventional MTJ element. The present invention provides a way in which to prevent the occurrence of read disturbs. Additional details regarding the occurrence of a read disturb will now be described below with reference to FIG. 4.

Figure 4:
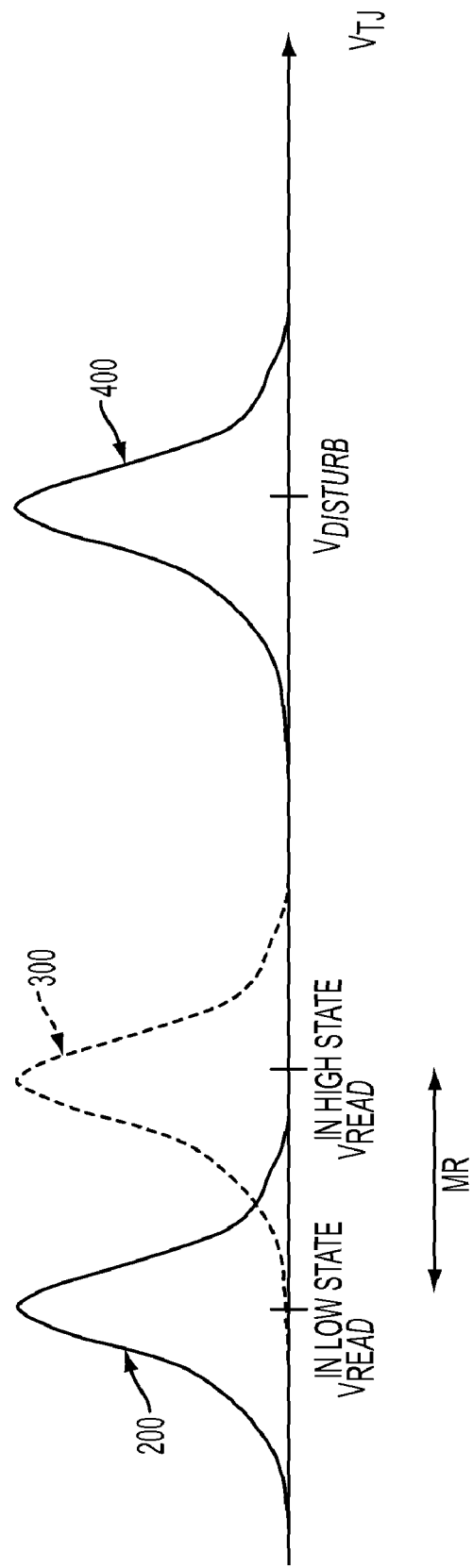
FIG. 4 is a graph illustrating a read voltage in a low resistance state compared to that of a high resistance state and that of a read disturb.

FIG. 4 is a graph illustrating various distributions of voltage across an MTJ element, including a read voltage in a low resistance state compared to that of a high resistance state. It also shows the distribution of voltage required to cause a read disturb. These are distributions because the MTJ elements and transistors both have distributions of resistances.

As shown in FIG. 4, the x-axis represents the voltage across the MTJ element ($V_{TJ}$). During a read operation of a bit, the voltage across the MTJ element 105 depends on whether the MTJ element 105 is in a "0" memory state or "1" memory state during a read operation. The resistance of the MTJ element 105 is higher in the "1" memory state and lower in the "0" memory state by a factor of approximately 2. According to an embodiment of the present invention, the resistance of the transistor 110 may be equal to the resistance of the MTJ element 105 in the low resistance state. For example, the resistance of the transistor 110 may be approximately 1000 ohms and the resistance of the MTJ element 105 in the "0" memory state may be approximately 1000 ohms while the resistance of the MTJ element 105 in the "1" memory state may be approximately 2000 ohms. The read voltage $V_{Read}$ across the MTJ element 105 is therefore different in the "0" memory state than in the "1" memory state such that it is higher in the "1" memory state than in the "0" memory state. For example, the read voltage $V_{Read}$ across the MJT element 105 in the high resistance state would be approximately ⅔ of the circuit voltage applied across the series combination of both MTJ element 105 and transistor 110 while in the low resistance state it would be approximately ½ of the circuit voltage applied. The solid line 200 represents the read voltage $V_{Read}$ in a low resistance state and the dashed line 300 represents the read voltage $V_{Read}$ of the MTJ element 105 in the high resistance state.

A read disturb occurs when reading a bit and passing a current through the MTJ element 105, the bit is accidently written. The voltage $V_{Disturb}$ across the respective MTJ element 105 for which a read disturb will occur is represented by the curve (reference numeral 400). The read voltage $V_{Read}$ may vary from one MTJ element 105 to the next because the resistance of the plurality of MTJ elements 105 may be different and the resistance of the plurality of transistors 110 may be different. If the curves represented by the solid line 200 or the dashed line 300 overlap the curve represented by 400, the bit is accidently written. However, according to an embodiment of the present invention, since the direction of the read current through the MTJ element 105 is such that it disturbs the MTJ element 105 into a high resistance state, the occurrence of a read disturb may be prevented as long as curve 200 does not overlap curve 400, even though curve 300 does overlap curve 400. Specifically, this means the preferred current flow direction to use for reading is for the electric current to flow from the pinned layer to the free magnetic layer, i.e. for the electrons to flow from the free magnetic layer to the pinned layer.

Figure 5:
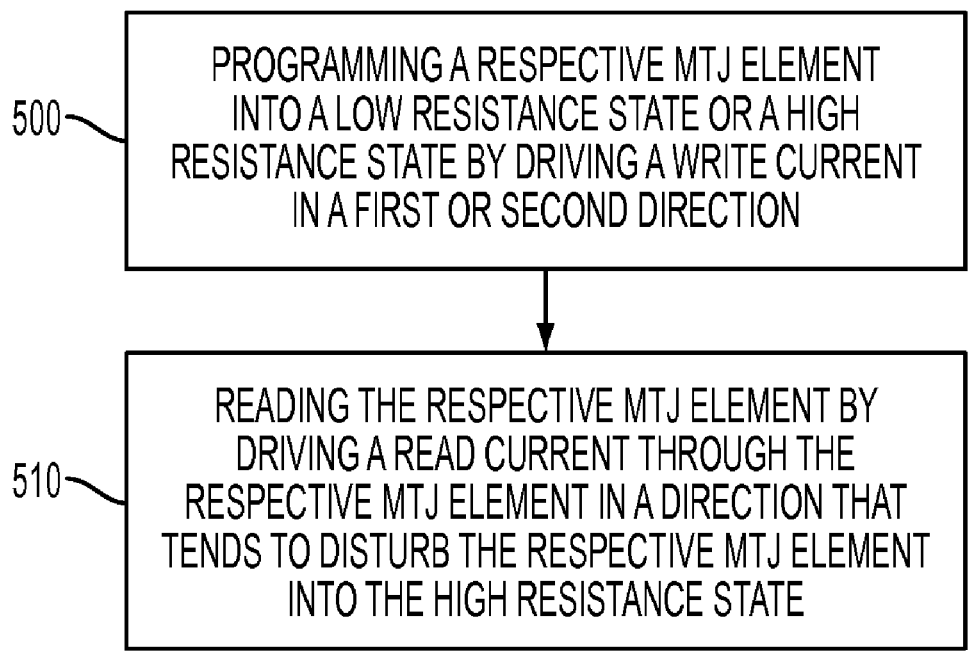
FIG. 5 is a flowchart illustrating a method for operating a spin-torque based memory device that can be implemented within embodiments of the present invention.

FIG. 5 is a flowchart illustrating a method of performing a read operation within a spin-torque based memory device that can be implemented within embodiments of the present invention. As shown in FIG. 5, in operation 500, a respective MTJ element is programmed into a low resistance state or a high resistance state by driving a write current in a first or second direction. Next, in operation 510, the respective MTJ element is read by driving a read current through the respective MTJ element in a direction that tends to disturb the respective MTJ element into the high resistance state.

According to an embodiment of the present invention, the read current is less than the write current in the first or second direction. Further, a read voltage across the respective MTJ element ranges from approximately 50 millivolts (mV) to approximately 100 mV.

Embodiments of the present invention, provide a read current in a direction through the MTJ elements which tends to disturb it into a high resistance state, to thereby prevent the occurrence of a read disturb.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin-torque based memory device comprising:
    a plurality of magnetic storage cells in an array, each magnetic storage cell includes at least one magnetic tunnel junction (MTJ) element; and
    at least one bit line and at least one bit complement line corresponding to the plurality of magnetic storage cells,
    wherein each respective MTJ element is written by driving a write current in a first or second direction to program the respective MTJ element in a low resistance state or a high resistance state and each respective MTJ element is read by driving a read current through the respective MTJ element in a direction that tends to disturb the respective MTJ element into the high resistance state.

2. The spin-torque based memory device of claim 1, wherein each MTJ element comprises a free magnetic layer, a tunnel barrier layer, and a pinned layer, and an electric current for reading flows from the pinned layer to the free magnetic layer.

3. The spin-torque based memory device of claim 1, wherein a read voltage across the respective MTJ element ranges from approximately 50 millivolts (mV) to approximately 100 mV.

4. The spin-torque based memory device of claim 1, further comprising:
    a plurality of word lines, each word line corresponding to a magnetic storage cell and allowing current to flow through the magnetic storage cell.

5. The spin-torque based memory device of claim 4, wherein each magnetic storage cell further comprises:
    a switching device which is activated by a respective word line to allow current to flow through the respective MTJ element.

6. The spin-torque based memory device of claim 5, wherein the respective word line is coupled to a gate of the switching device.

7. A computer-implemented method for operating a spin-torque based memory device including a plurality of magnetic storage cells each including at least one magnetic tunnel junction (MTJ) element, the method comprising:
    programming a respective MTJ element into a low resistance state or a high resistance state by driving a write current in a first or second direction; and
    reading the respective MTJ element by driving a read current through the respective MTJ element in a direction that tends to disturb the respective MTJ element into the high resistance state.

8. The computer-implemented method of claim 7, wherein each MTJ element comprises a free magnetic layer, a tunnel barrier layer, and a pinned layer, and an electric current for reading flows from the pinned layer to the free magnetic layer.

9. The computer-implemented method of claim 7, wherein a read voltage across the respective MTJ element ranges from approximately 50 millivolts (mV) to approximately 100 mV.

10. The computer-implemented method of claim 7, further comprising:
    allowing current to flow through the magnetic storage cell via a word line corresponding to the magnetic storage cell and.

11. The computer-implemented method of claim 10, further comprising:
    activating a respective switching device connected in series with the respective MTJ element via a respective word line to allow current to flow through the respective MTJ element.

12. The computer-implemented method of claim 11, further comprising:
    coupling the respective word line to a gate of the switching device.

13. A computer program product comprising a computer useable medium including a computer readable program, wherein the computer readable program when performed on a computer causes the computer to implement a method for operating a spin-torque based memory device including a plurality of magnetic storage cells each including at least one magnetic tunnel junction (MTJ) element, the method comprising:
    programming a respective MTJ element into a low resistance state or a high resistance state by driving a write current in a first or second direction; and
    reading the respective MTJ element by driving a read current through the respective MTJ element in a direction that tends to disturb the respective MTJ element into the high resistance state.

14. The computer program product of claim 13, wherein each MTJ element comprises a free magnetic layer, a tunnel barrier layer, and a pinned layer, and electric current for reading flows from the pinned layer to the free magnetic layer.

15. The computer program product of claim 13, wherein a read voltage across the respective MTJ element ranges from approximately 50 millivolts (mV) to approximately 100 mV.

16. The computer program product of claim 13, wherein the method further comprises:
    allowing current to flow through the magnetic storage cell via a word line corresponding to the magnetic storage cell and.

17. The computer program product of claim 16, wherein the method further comprises:

activating a respective switching device connected in series with the respective MTJ element via a respective word line to allow current to flow through the respective MTJ element.

18. The computer program product of claim 17, the method further comprises:

coupling the respective word line to a gate of the switching device.

\* \* \* \* \*